United States Patent
Kawano et al.

(10) Patent No.: US 8,860,520 B2
(45) Date of Patent: Oct. 14, 2014

(54) PULSE GENERATOR AND SEMICONDUCTOR INTEGRATED CIRCUIT

(71) Applicant: Fujitsu Limited, Kawasaki (JP)

(72) Inventors: Yoichi Kawano, Setagaya (JP);
Toshihide Suzuki, Zama (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 13/658,108

(22) Filed: Oct. 23, 2012

(65) Prior Publication Data

US 2013/0169372 A1 Jul. 4, 2013

(30) Foreign Application Priority Data

Dec. 28, 2011 (JP) ................. 2011-288280

(51) Int. Cl.
*H03K 3/64* (2006.01)
*H03K 3/355* (2006.01)

(52) U.S. Cl.
USPC ................ 331/173; 331/113 R

(58) Field of Classification Search
USPC .......... 331/113 R, 172–174; 375/256; 377/96
See application file for complete search history.

(56) References Cited

U.S. PATENT DOCUMENTS

| 3,727,149 | A  | * | 4/1973 | Kimura ................. 331/1 R |
| 6,781,470 | B2 | * | 8/2004 | Rogerson ............... 331/57 |
| 7,420,503 | B2 | * | 9/2008 | Uchino ................. 342/70 |
| 7,474,164 | B2 | * | 1/2009 | Saito et al. ........... 331/167 |
| 7,522,004 | B2 | * | 4/2009 | Saito .................. 330/310 |
| 7,719,373 | B2 | * | 5/2010 | Ryckaert et al. ........ 331/173 |
| 8,160,118 | B2 | * | 4/2012 | Dallum et al. .......... 375/130 |
| 8,427,242 | B2 | * | 4/2013 | Raphaeli et al. ........ 331/1 A |
| 8,599,944 | B2 | * | 12/2013 | Sato et al. ............ 375/261 |
| 2001/0009404 | A1 | * | 7/2001 | Paese et al. ........... 342/28 |
| 2008/0260019 | A1 | * | 10/2008 | Aoyagi ................ 375/239 |

FOREIGN PATENT DOCUMENTS

JP 2007-174087 A1 7/2007

OTHER PUBLICATIONS

T. Phan, et al.; "A 18-pJ/Pulse OOK CMOS Transmitter for Multiband UWB Impulse Radio;" IEEE Microwave and Wireless Components Letters; vol. 17; No. 9; Sep. 2007; pp. 688-690 (3 Sheets)/ p. 1 of specification.

* cited by examiner

Primary Examiner — Levi Gannon
(74) Attorney, Agent, or Firm — Kratz, Quintos & Hanson, LLP

(57) ABSTRACT

A pulse generator includes an oscillation circuit that generates a burst signal oscillated for ultrawideband band and a generation circuit that generates a trigger signal that causes oscillation by the oscillation circuit to be started.

8 Claims, 10 Drawing Sheets

G : LOOP GAIN
N : NUMBER OF REPEATS

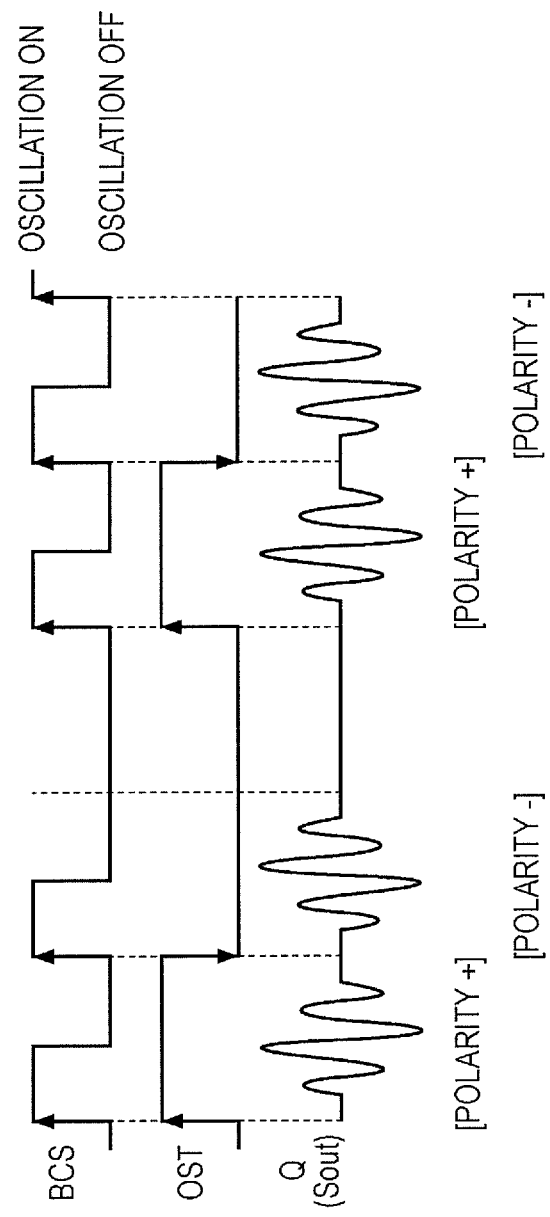

PULSE GENERATOR AND SEMICONDUCTOR INTEGRATED CIRCUIT

CROSS-REFERENCE TO RELATED APPLICATION

This application is based upon and claims the benefit of priority of the prior Japanese Patent Application No. 2011-288280, filed on Dec. 28, 2011, the entire contents of which are incorporated herein by reference.

FIELD

The embodiments discussed herein relate to a pulse generator and a semiconductor integrated circuit.

BACKGROUND

Recent developments have focused on ultrawideband (UWB) communication and UWB radar and various techniques have been developed. For example, UWB communication transfer rates have been improved so that as the pulse time width becomes smaller, the bandwidth can be made correspondingly wider.

Methods using short pulses as a signal source or methods of using a burst oscillation circuit have been adopted to achieve this type of UWB communication and UWB radar. For example, methods using a burst oscillation circuit involve controlling the ON/OFF of the burst oscillation circuit in response to burst control signals to oscillate the burst oscillation circuit for only certain time periods to generate burst oscillation signals.

Conventionally, various types of pulse generators have been considered for adoption in UWB communication and UWB radar.

Japanese Laid-open Patent Publication No. 2007-174087 and Tuan-Anh Phan et al., "A 18-pJ/Pulse OOK CMOS Transmitter for Multiband UWB Impulse Radio," IEEE Microwave and Wireless Components Letters, Vol. 17, No. 9, September 2007 are examples of the related technology.

As described above, a pulse generator adopted for UWB communication and UWB radar is used to control the ON/OFF of a burst oscillation circuit in response to burst control signals.

Specifically, a transistor switch is provided between differential terminals of a burst oscillation circuit (differential amplification circuit). When the level of a burst control signal is high (H), a switch is turned OFF (oscillating state), and when the level is low (L), the switch is turned ON (oscillation stopped).

However, a delay is caused in the period of time from switching the transistor from ON to OFF until oscillation actually starts, that is, the time until the oscillation rises in the abovementioned pulse generator.

This time delay until the rise of oscillation is a serious problem in UWB communication and UWB radar using pulse signals (carriers) in the range of several tens of GHz (e.g., 60 to 90 GHz).

SUMMARY

According to an aspect of the embodiments, a pulse generator includes an oscillation circuit that generates a burst signal oscillated for ultrawideband band, and a generation circuit that generates a trigger signal that causes oscillation by the oscillation circuit to be started.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 describes operations of the pulse generator in FIG. 8; and

DESCRIPTION OF EMBODIMENTS

Before discussing the embodiments of the pulse generator, an example of an ultrawideband (UWB) communication system, a pulse generator, and problems thereof will be described with reference to FIGS. 1 to 4B.

Figure 1:
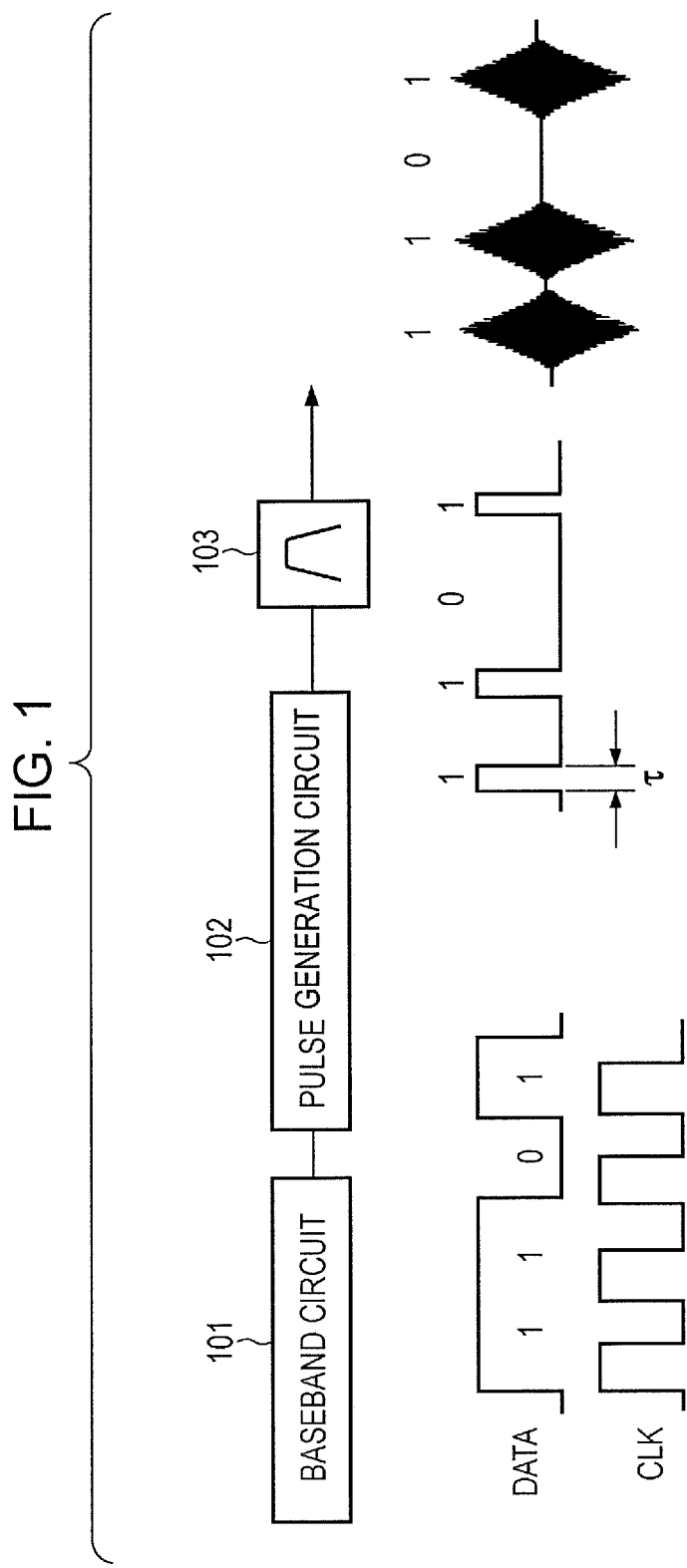
FIG. 1 describes an example of an ultrawideband communication system.

FIG. 1 illustrates an example of an ultrawideband communication system using short pulses as a signal source. In FIG. 1, reference numeral 101 refers to a baseband circuit, 102 refers to a pulse generator, and 103 refers to a bandpass filter.

As illustrated in FIG. 1, the baseband circuit 101, for example, processes a pre-modified baseband signal generated from data DATA ([1 1 0 1 . . . ]) and outputs the signal to the pulse generator 102 in a UWB communication system that uses short pulses as a signal source.

The pulse generator 102, for example, generates short pulses of a time width corresponding to the data ([1 1 0 1 . . . ]). After the short pulses are band limited by the bandpass filter 103, a signal (high frequency pulse signal) corresponding to the data ([1 1 0 1 . . . ]) is output.

The pulse generator used in this type of UWB communication system that uses short pulses as a signal source is expensive since a high-cost bandpass filter 103 is desirably used.

Figure 2:
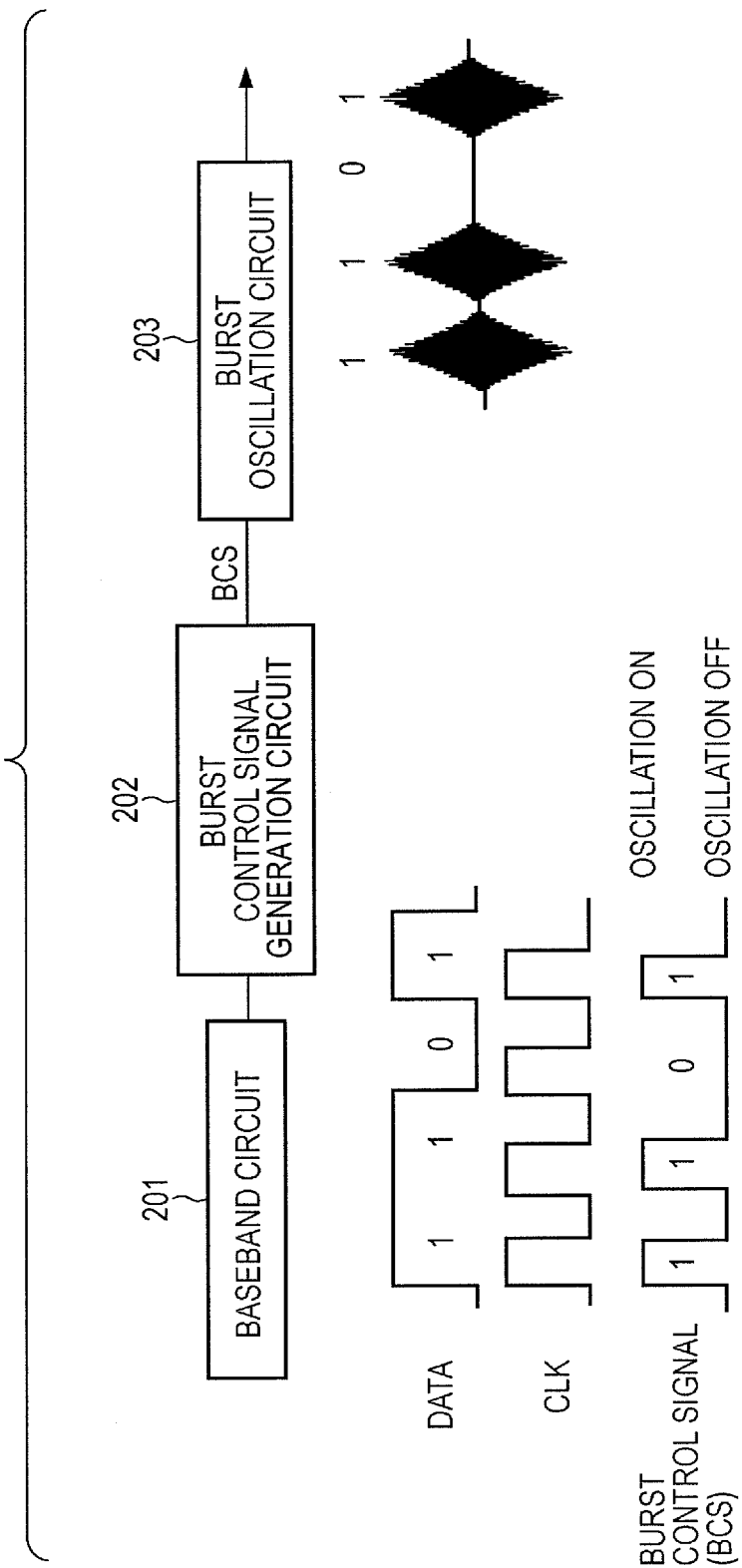
FIG. 2 describes another example of an ultrawideband communication system.

FIG. 2 describes another example of an ultrawideband communication system that uses a burst oscillation circuit that oscillates only for a certain period of time. In FIG. 2, the reference numeral 201 refers to a baseband circuit, 202 refers to a burst control signal generation circuit, and 203 refers to a burst oscillation circuit.

As illustrated in FIG. 2, the baseband circuit 201, for example, processes a pre-modified baseband signal generated from data DATA ([1 1 0 1 . . . ]) and outputs the signal to the burst control signal generation circuit 202 in a UWB communication system that uses a burst oscillation circuit.

The burst control signal generation circuit 202 generates a burst control signal BCS corresponding to the data ([1 1 0 1 . . . ]) and outputs the burst control signal BCS to the burst oscillation circuit 203.

The burst oscillation circuit 203 is controlled by the burst control signal BCS so that oscillation occurs when, for example, the BCS (burst control signal) is "H" (oscillation ON), and oscillation is stopped when the BCS is "L" (oscillation OFF).

Figure 3:
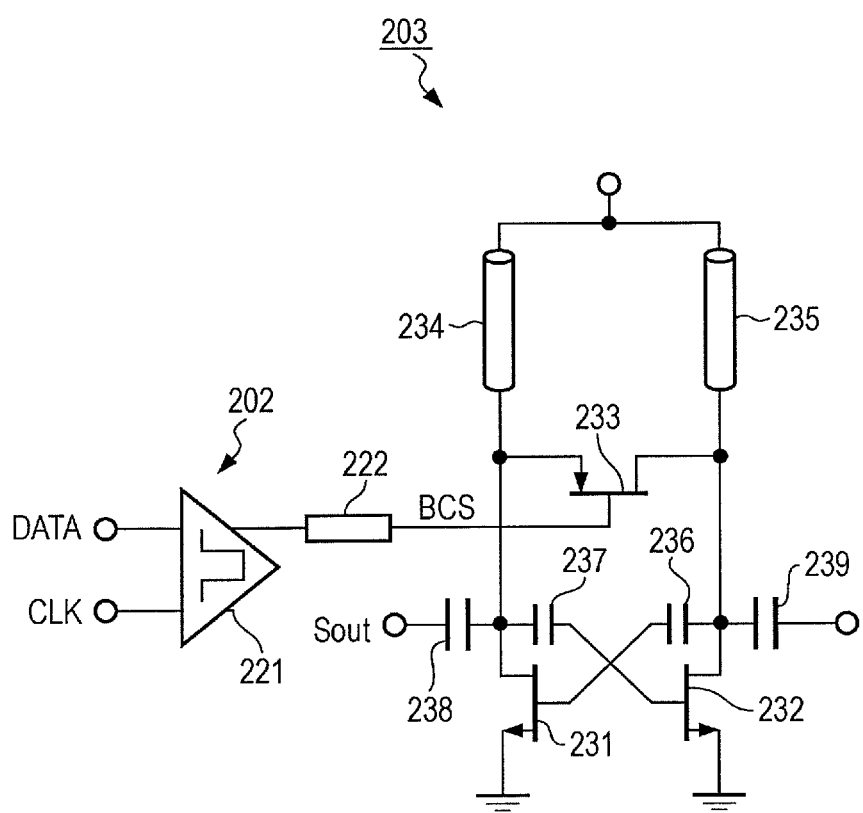
FIG. 3 is a circuit diagram illustrating an example of a pulse generator for achieving the ultrawideband communication system illustrated in FIG. 2.

FIG. 3 is a circuit diagram illustrating an example of a pulse generator that achieves the ultrawideband communication system illustrated in FIG. 2, and describes the burst control signal generation circuit 202 and the burst oscillation circuit 203.

As illustrated in FIG. 3, the burst control signal generation circuit 202 includes a load 222 and an amplifier 221 that receives the data DATA and a clock CLK, and generates, for example, a burst control signal BCS as described above with reference to FIG. 2.

The burst oscillation circuit 203 is configured as a differential amplifier circuit including n-channel type MOS (n-MOS) transistors 231 and 232, a p-channel type MOS (p-MOS) transistor 233, load elements 234 and 235, and capacitors 236 to 239.

The n-MOS transistors 231 and 232 are cross-connected to a gate and a drain through the capacitors 236 and 237, respectively. A burst oscillation signal (output signal), Sout is output from the drain of the transistor 231 through the capacitor 238. Each of the load elements 234 and 235 may use an inductor or a length of a line, for example.

The p-MOS transistor 233 is provided between differential terminals of the differential amplifier circuit 203 (between the drains of transistors 231 and 232), and functions as a switch element to control the oscillation corresponding to the burst control signal BCS input to the gate.

Specifically, the transistor 233 is turned OFF when the level of the burst control signal BCS is "H" so that the differential amplifier circuit 203 enters an oscillating state. The transistor 233 is turned ON when the level is "L" so that the oscillation is stopped.

Figure 4A:
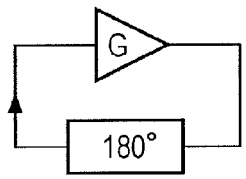
FIGS. 4A and 4B describe amplitude growth in the pulse generator in FIG. 3.
Figure 4B:
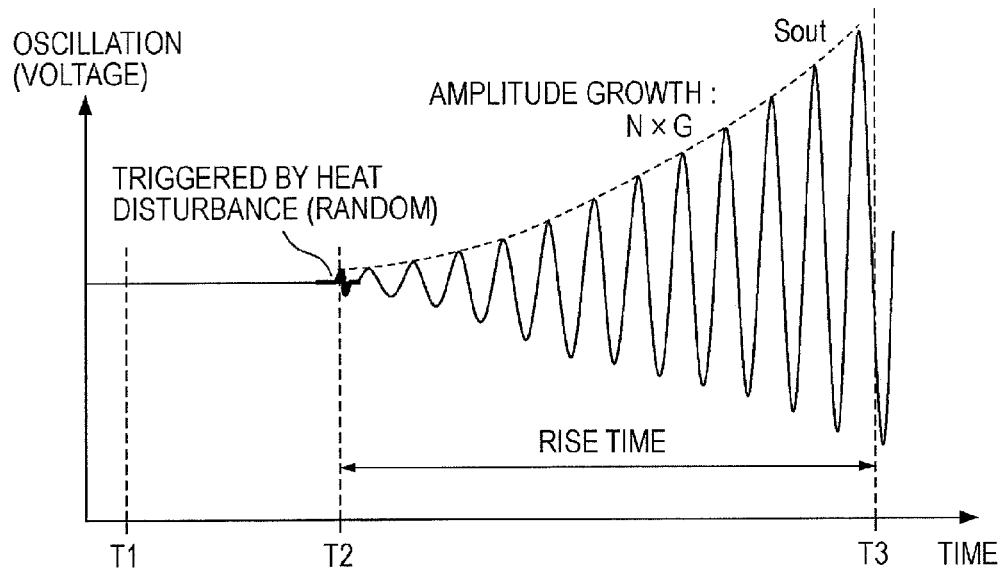

FIGS. 4A and 4B describe amplitude growth of the pulse generator illustrated in FIG. 3. FIG. 4A illustrates the function of the pulse generator (differential amplifier circuit 203) illustrated in FIG. 3, and FIG. 4B illustrates the output signal (burst oscillation signal) Sout of the differential amplifier circuit 203.

As illustrated in FIG. 4A, the differential amplifier circuit (burst oscillation circuit) 203 in FIG. 3 becomes positive feedback circuit of a loop gain G based on the pair of differential transistors 231 and 232 respectively cross-connected to the gate and the drain through the capacitors 236 and 237.

As a result, when the oscillation starts, the burst oscillation signal Sout increases in amplitude due to the loop gain G according to the number of repeats N as illustrated in FIG. 4B. The reference numeral T1 in FIG. 4B indicates a timing in which the burst control signal BCS changes from "L" to "H" to enable the oscillation of the burst oscillation circuit 203.

The reference numeral T2 illustrates a timing in which, for example, a thermal disturbance (random) becomes a trigger to start oscillation, and T3 illustrates a timing in which the oscillated output signal (burst oscillation signal) Sout reaches a desired amplitude. The rise time in FIG. 4B indicates a period of time from the timing T2 in which oscillation starts until the timing T3 in which the desired amplitude is achieved.

As illustrated in FIG. 4B, the burst oscillation circuit 203 of FIG. 3 does not start oscillating immediately at the timing T1 when the burst control signal BCS changes from "L" to "H", but starts oscillating from the timing T2 in which the oscillation starts due to a trigger such as the thermal disturbance.

Specifically, the pulse generator illustrated in FIG. 3 reaches steady state oscillation at a desired amplitude (T3) after the start of the oscillation (T2) due to noise such as heat and the like and after a certain rise time.

Although the period of time until steady state oscillation is reached becomes smaller in correspondence to a larger loop gain G of the oscillation circuit (203), improving the loop gain of an oscillation circuit is difficult when the transistor gain is small in ultra-high frequencies such as millimeter wavebands. As a result, it is difficult to reduce the amount of time until the rise of the oscillation.

Hereinbelow, embodiments of a pulse generator and a semiconductor integrated circuit will be described with reference to the accompanying drawings.

Figure 5A:
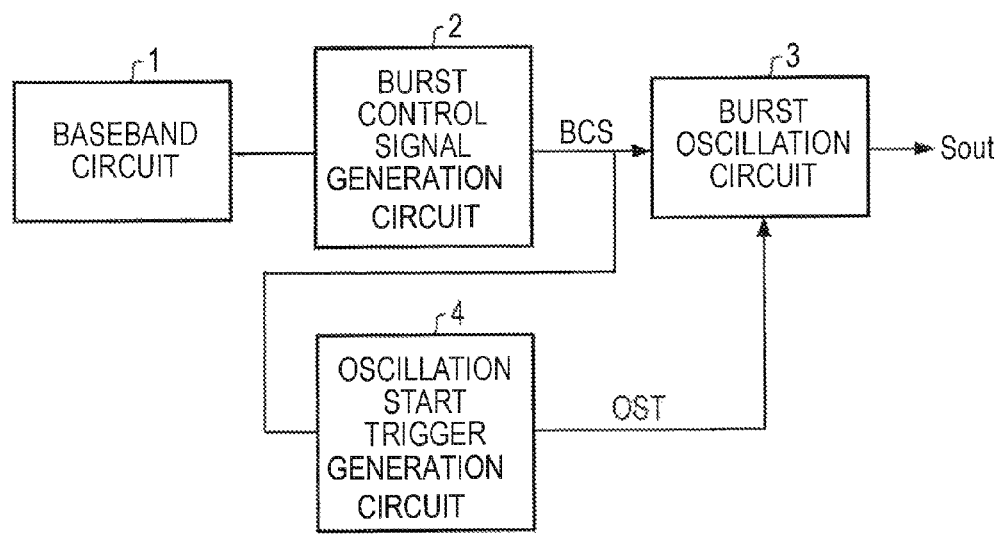
FIGS. 5A and 5B describe a semiconductor integrated circuit of a present embodiment.
Figure 5B:
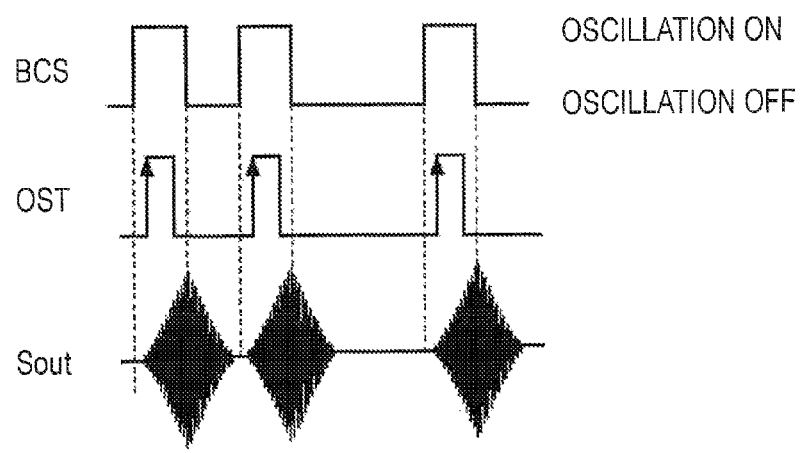

FIGS. 5A and 5B illustrate a semiconductor integrated circuit of the present embodiment. FIG. 5A is a block diagram of the semiconductor integrated circuit of the present embodiment, and FIG. 5B illustrates the timing of signals from a pulse generator in the semiconductor integrated circuit of FIG. 5A.

As illustrated in FIG. 5A, the semiconductor integrated circuit of the present embodiment includes a baseband circuit 1, a burst control signal generation circuit 2, a burst oscillation circuit 3, and an oscillation start trigger generation circuit 4.

The baseband circuit 1, the burst control signal generation circuit 2, the burst oscillation circuit 3, and the oscillation start trigger generation circuit 4 may be formed on one semiconductor chip to be configured as the semiconductor integrated circuit. As described hereinbelow, the pulse generator of the present embodiment includes the burst control signal generation circuit 2, the burst oscillation circuit 3, and the oscillation start trigger generation circuit 4.

The baseband circuit 1, the burst control signal generation circuit 2, and the burst oscillation circuit 3 are substantially applicable to the ones described above with reference to FIGS. 2 and 3. The oscillation start trigger generation circuit 4 generates an oscillation start trigger signal OST and outputs the same to the burst oscillation circuit 3.

As illustrated in FIG. 5B, when the burst control signal BCS changes from a low level "L" to a high level "H", the burst oscillation circuit 3 enters a state in which oscillation is possible. The oscillation start trigger generation circuit 4 receives the change of the burst control signal BCS from "L" to "H" and outputs the oscillation start trigger signal OST that rises from "L" to "H" to the burst oscillation circuit 3.

Specifically, the burst oscillation circuit 3 of the present embodiment forcefully causes the start of oscillation through the oscillation start trigger signal OST in the state in which oscillation is possible when the burst control signal BCS becomes "H" instead of, for example, oscillation being started when a thermal disturbance becomes the trigger.

As a result, the period of time from when the oscillation actually starts until the burst oscillation signal Sout is output may be greatly reduced after the burst oscillation circuit 3 enters the state in which oscillation is possible due to the burst control signal BCS. As a result, for example, a UWB communication transfer rate may be improved.

Figure 6:
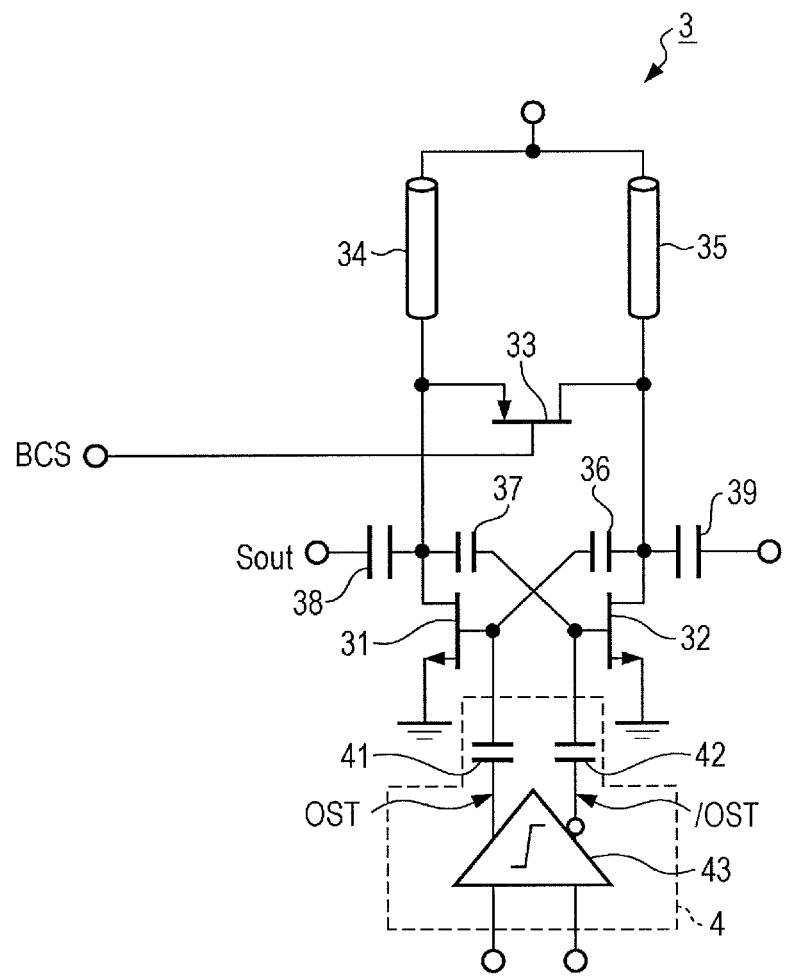
FIG. 6 is a circuit diagram illustrating a portion of a pulse generator of a first embodiment.

FIG. 6 is a circuit diagram illustrating a portion of a first embodiment of the pulse generator, and illustrates the burst oscillation circuit 3 and the oscillation start trigger generation circuit 4.

As illustrated in FIG. 6, the burst oscillation circuit 3 is configured in a similar way as the burst oscillation circuit 203 described above with reference to FIG. 3, and includes the n-MOS transistors 31 and 32, the p-MOS transistor 33, the load elements 34 and 35, and the capacitors 36 to 39.

The n-MOS transistors 31 and 32 are respectively cross-connected to a gate and a drain through the capacitors 36 and 37, and the burst oscillation signal (output signal) Sout is output from the drain of the transistor 31 through the capacitor 38.

The p-MOS transistor 33 is provided between differential terminals of the burst oscillation circuit (differential amplifier circuit) 3, and functions as a switch element to control the oscillation corresponding to the burst control signal BCS input toward the gate.

Specifically, the transistor 33 is turned OFF when the level of the burst control signal BCS is high "H" so that the burst oscillation circuit 3 enters an oscillating state (oscillation possible state). The transistor 33 is turned ON when the level is low "L" so that the oscillation is stopped.

The oscillation start trigger generation circuit 4 includes capacitors 41 and 42 and a differential amplifier 43, and outputs differential signals (oscillation start trigger signals) OST and /OST to the gates (differential input terminals) of the pair of differential transistors 31 and 32 through the capacitors 41 and 42. The signal /OST indicates a signal with a logic inverse to the signal OST.

The oscillation start trigger signal OST (and /OST) changes from "L" to "H", for example, immediately after the burst control signal BCS input to the gate of the transistor 33 is changed from "L" to "H" as illustrated in FIG. 5A.

A desired excitation to oscillation is conducted in the burst oscillation circuit 3 to forcefully start oscillation according to the changes of the oscillation start trigger signals OST and /OST that are input to the control terminals (gates) of the pair of differential transistors 31 and 32.

The reason that the capacitors 41 and 42 are inserted between the output of the differential amplifier 43 and the gates of the pair of differential transistors 31 and 32 is because a direct-current signal component is unnecessary since the oscillation start trigger signals OST and /OST cause the oscillation of a single burst oscillation circuit 3 to start.

The burst oscillation circuit 3 changes the burst control signal BCS to "L" to turn the transistor 33 ON. The oscillation is stopped by a short-circuit between the differential terminals of the burst oscillation circuit (differential amplifier circuit) 3.

In this way, according to the pulse generator of the first embodiment, the burst oscillation circuit is able to output a burst oscillation signal in a short time period due to an oscillation start trigger signal immediately after entering the state in which oscillation is possible due to a burst control signal. As a result, for example, the UWB communication transfer rate may be improved.

Figure 7:
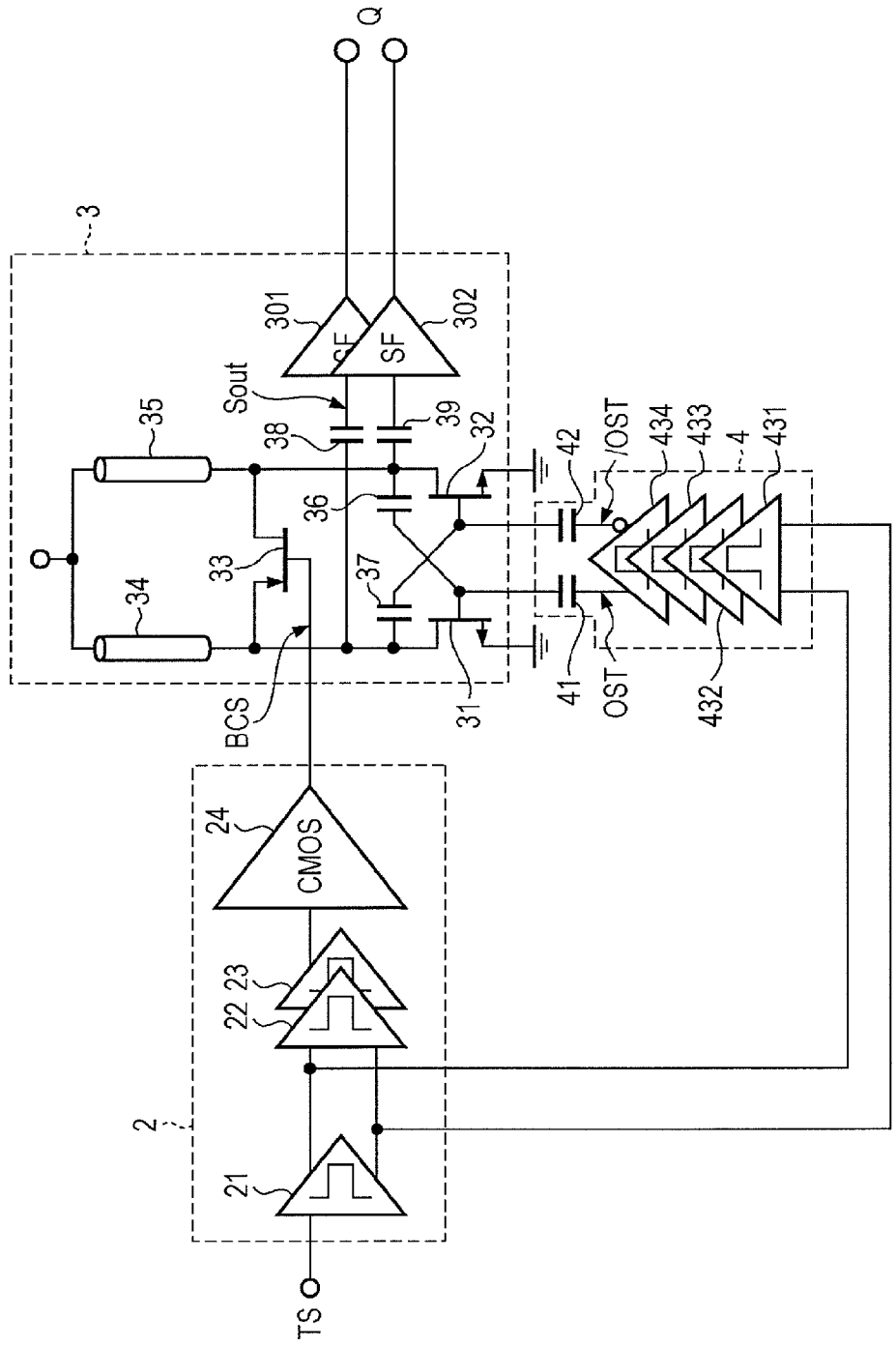
FIG. 7 is a circuit diagram illustrating a pulse generator of a second embodiment.

FIG. 7 is a circuit diagram illustrating a second embodiment of a pulse generator, and illustrates the burst control signal generation circuit 2, the burst oscillation circuit 3, and the oscillation start trigger generation circuit 4.

As may be seen when comparing FIG. 7 with FIG. 6 described above, the oscillation start trigger generation circuit 4 in the pulse generator of the second embodiment has capacitors 41 and 42, and four differential amplifiers 431 to 434.

The burst control signal generation circuit 2 has three differential amplifiers 21 to 23 and a CMOS amplifier 24. The first differential amplifier 21 in the burst control signal generation circuit 2 receives, for example, a transfer signal TS from the baseband circuit 1 and outputs a differential output signal to the second differential amplifier 22 and to the oscillation start trigger generation circuit 4.

The output signal of the first differential amplifier 21 in the burst control signal generation circuit 2 is input into the CMOS amplifier 24 via the second and third differential amplifiers 22 and 23, and a burst control signal BCS is output from the CMOS amplifier 24. The burst control signal BCS is input into the gate of the transistor 33 in the burst oscillation circuit 3 so that the oscillation state of the burst oscillation circuit 3 is controlled.

The burst oscillation circuit 3 of the second embodiment further includes sample-hold circuits 301 and 302 as opposed to the burst oscillation circuit of the first embodiment described above with reference to FIG. 6. Output signals Q are output through the sample-hold circuits 301 and 302.

The output signal from the first differential amplifier 21 in the burst control signal generation circuit 2 is amplified by the four differential amplifiers 431 to 434 in the oscillation start trigger generation circuit 4 and output as oscillation start trigger signals OST and /OST having sharp rising edges. The oscillation start trigger signals OST and /OST are input into the gates of the pair of differential transistors 31 and 32 through the capacitors 41 and 42.

The reason that the four differential amplifiers are provided in the oscillation start trigger generation circuit 4 is because the timing of differential amplifier 21 output signal to control the switching of the transistor 33 is delayed by the two differential amplifiers 22 and 23 and the CMOS amplifier 24.

That is, since the transistor 33 is controlled by the burst control signal BCS that includes a delay due to the three amplifier circuits 22 to 24, four amplifiers 431 to 434 are provided to generate oscillation start trigger signals OST and /OST that are delayed slightly more than the burst control signal BCS.

In this way, according to the pulse generator of the embodiment, the burst oscillation circuit may output a burst oscillation signal (output signal Q) immediately after entering a state in which oscillation is possible due to the oscillation start trigger signal that is delayed more than the burst control signal. As a result, for example, the UWB communication transfer rate may be improved.

Figure 8:
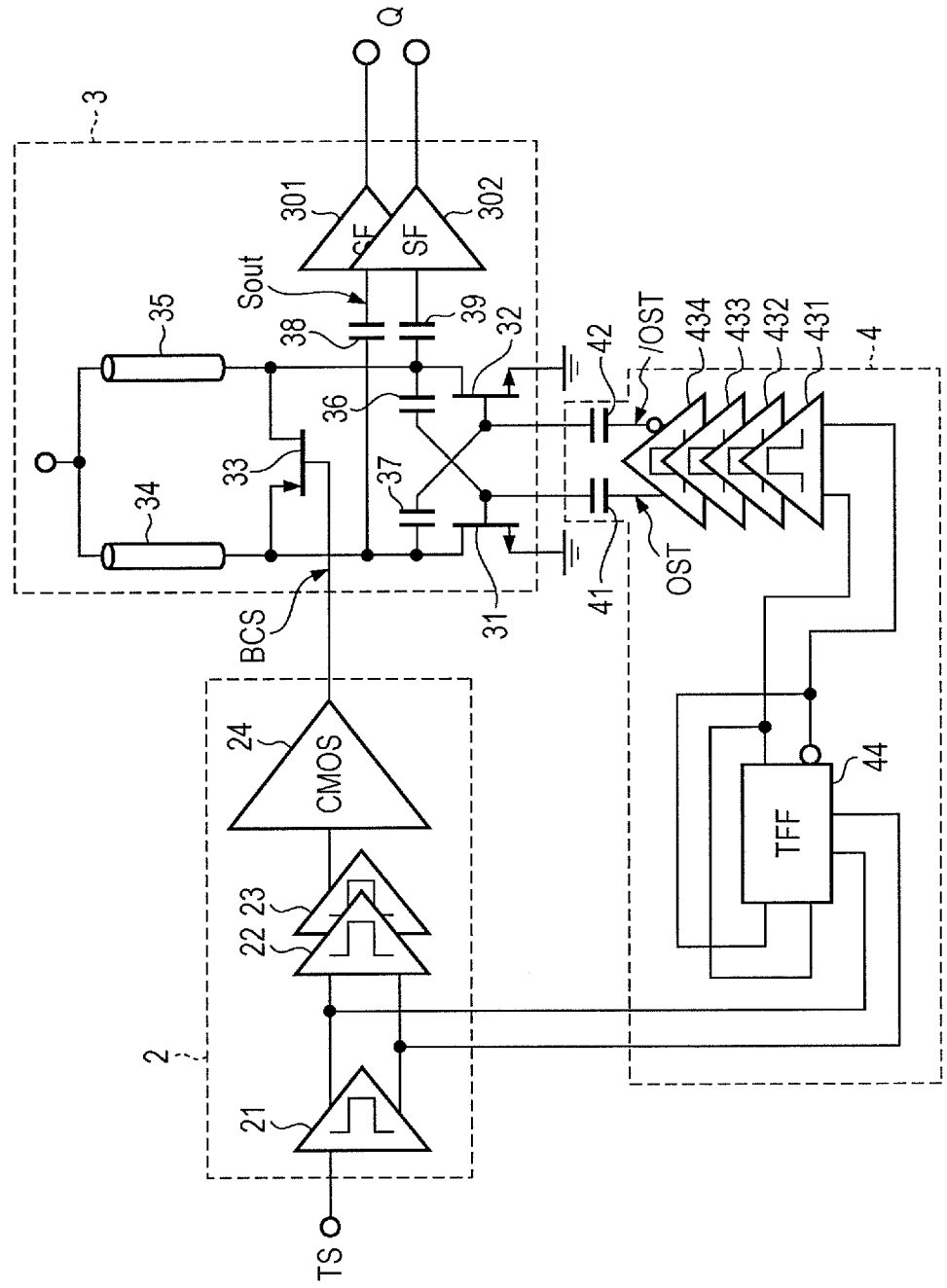
FIG. 8 is a circuit diagram illustrating a pulse generator of a third embodiment.

FIG. 8 is a circuit diagram illustrating a third embodiment of the pulse generator, and FIG. 9 describes operations of the pulse generator illustrated in FIG. 8. FIG. 8 illustrates the burst control signal generation circuit 2, the burst oscillation circuit 3, and the oscillation start trigger generation circuit 4 in the same way as the second embodiment illustrated in FIG. 7.

As may be seen by comparing FIG. 8 with the abovementioned FIG. 7, the oscillation start trigger generation circuit 4 in the pulse generator of the third embodiment further includes a T-shaped flip-flop (TFF) 44 in contrast to the pulse generator of the second embodiment illustrated in FIG. 7.

The output signal from the first differential amplifier 21 in the burst control signal generation circuit 2 is input into the four differential amplifiers 431 to 434 through the TFF 44 in the oscillation start trigger generation circuit 4.

As illustrated in FIG. 9, the oscillation start trigger generation circuit 4 outputs the oscillation start trigger signal OST with the polarity inverting in order according to the timing in which the output signal (burst control signal BCS) from the differential amplifier 21 changes from "L" to "H" due to the provision of the TFF 44.

That is, the phase of the output signal Q may be alternately inverted due to the inversion of the polarity of the oscillation start trigger signals OST and /OST with each output signal Q (burst oscillation signal Sout).

If the phase of the output signal Q remains the same, the spectral intensity of the oscillation frequency becomes too intense. However, by alternately inverting the phase, the signal intensity of the oscillation frequency may be suppressed.

In this way, according to the pulse generator of the third embodiment, the average power may be reduced with the suppression of the oscillation frequency signal intensity by alternately inverting the phase of the output signal Q. Moreover, the effects of noise on other equipment due to the output signal Q may also be reduced.

In this way, according to the pulse generator of the third embodiment, the burst oscillation circuit may output the output signal Q immediately after entering a state in which oscillation is possible due to the oscillation start trigger signal that is delayed more than the burst control signal in the same way as in the second embodiment. As a result, for example, the UWB communication transfer rate may be improved.

Figure 10A:
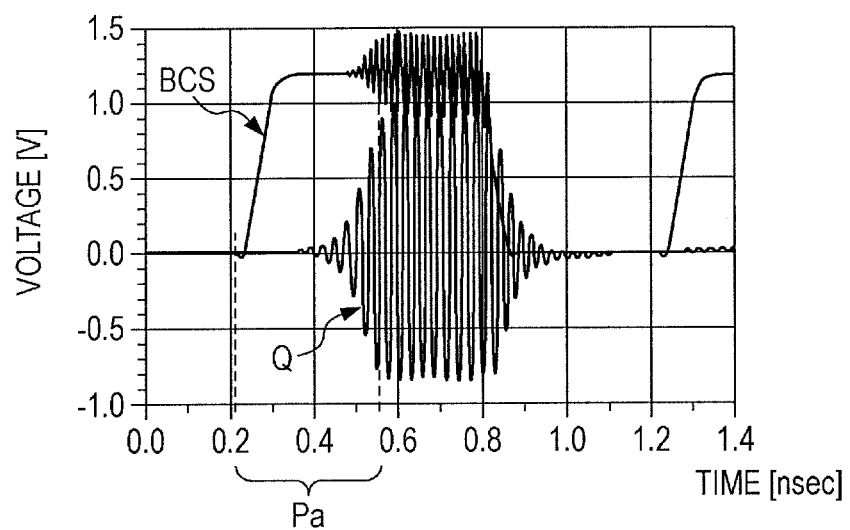
FIGS. 10A and 10B describe the oscillation rise generated by the pulse generator of the present embodiment.
Figure 10B:
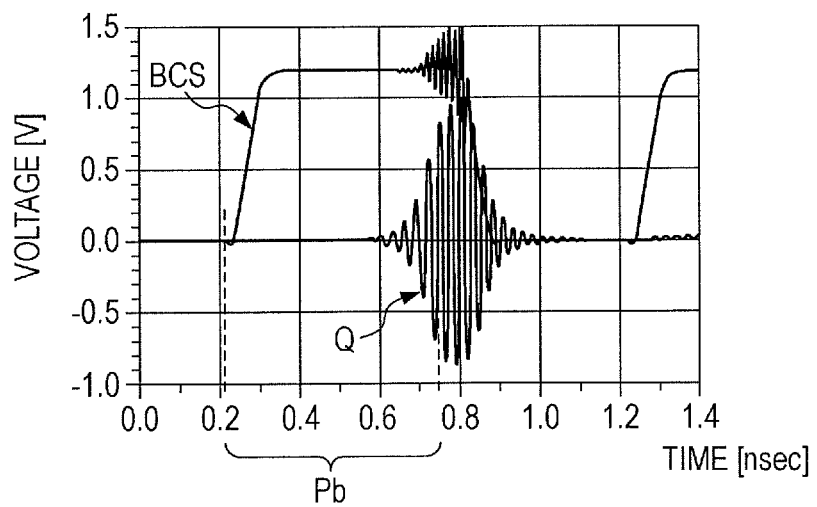

FIGS. 10A and 10B describe the oscillation rise of the pulse generator of the present embodiment. FIG. 10A illustrates a rise waveform when an oscillation trigger signal is applied, and FIG. 10B illustrates a rise waveform when no oscillation trigger signal is applied.

That is, FIG. 10A illustrates a waveform when the output signal (oscillation start trigger signal OST or /OST) of the oscillation start trigger generation circuit 4 is output (ON) in the pulse generator illustrated in FIG. 6 for example, and FIG. 10B illustrates a waveform when the output of the output signal is stopped (OFF). An oscillation frequency of 38 GHz is used.

As may be seen when comparing the FIGS. 10A and 10B, among the periods Pa and Pb from the rise of the burst control signal BCS to "H" until the output signal Q reaches the desired amplitude, the period Pa in which the oscillation start trigger signal is ON is slightly shorter than the period Pb.

That is, whereas the period Pb when the oscillation start trigger signal is OFF as illustrated in FIG. 10B is approximately 550 ns, the period Pa when the oscillation start trigger signal is ON as illustrated in FIG. 10A is approximately 350 ns. Thus, it may be seen that the period Pa is approximately 200 ns shorter than the period Pb.

The effects of reducing the time until the rise of the oscillation changes due to the circuitry and the frequency used and the like. However, the time until the rise of the oscillation may be suitably reduced by applying the oscillation start trigger signal to the burst oscillation circuit to forcefully start the oscillation.

The effect of reducing the time of the rise of the oscillation is desirable, for example, in a system that uses short pulses as a signal source such as in UWB communication, and may greatly improve the transfer rate.

As described hereinbelow, the pulse generator of the abovementioned embodiments that includes the burst control signal generation circuit 2, the burst oscillation circuit 3, and the oscillation start trigger generation circuit 4 is not limited to those illustrated in FIGS. 6 to 8, and may be changed as appropriate.

For example, although the burst oscillation circuit 3 has been described as a differential amplifier circuit in FIGS. 6 to 8, the burst oscillation circuit 3 is not limited to a differential circuit and may be any circuit that forcefully starts oscillation due to an oscillation start trigger signal instead of a thermal disturbance.

Furthermore, as illustrated in FIG. 5A, the pulse generator of the first to third embodiments illustrated in FIGS. 6 to 8 respectively may be a semiconductor integrated circuit formed on one semiconductor chip along with the baseband circuit 1 and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A pulse generator, comprising:
   an oscillation circuit that generates a burst signal oscillated for ultrawideband band;
   a generation circuit that generates a trigger signal that causes oscillation by the oscillation circuit to be started; and
   a signal generation circuit that generates a control signal to control an oscillation state of the oscillation circuit;
   wherein the oscillation circuit is a differential amplifier circuit including
   a first differential transistor and a second differential transistor that are cross-connected to conduct oscillation, and
   a switch element that controls the oscillation state of the oscillation circuit based on the control signal; and
   wherein the trigger signal is input into the gates of the first and second differential transistors.

2. The pulse generator according to claim 1, wherein the generation circuit generates the trigger signal according to the control signal.

3. The pulse generator according to claim 1, wherein the switch element is provided between differential terminals of the differential amplifier circuit; and
   the differential amplifier circuit. enters a state in which oscillation is possible when the switch element is turned off by the control signal.

4. The pulse generator according to claim 1, wherein the oscillation circuit enters a state in which oscillation is stopped when the control signal is a first level, and enters a state in which oscillation is possible when the control signal is a second level that is different from the first level.

5. The pulse generator according to claim 4, wherein the generation circuit generates the trigger signal with a polarity that inverts in order according to a timing in which the control signal changes from the first level to the second level.

6. The pulse generator according to claim 5, wherein the trigger signal includes:
   a first polarity signal that is input as a positive signal into the gate of the first differential transistor, and is input as a negative signal into the gate of the second differential transistor; and
   a second polarity signal that is input as a negative signal into the gate of the first differential transistor, and is input as a positive signal into the gate of the second differential transistor; and wherein
   the generation circuit alternately generates the first polarity signal and the second polarity signal and outputs the oscillation signal in which the phase is alternately inverted.

7. A semiconductor circuit, comprising:
   a pulse generator including:
   an oscillation circuit that generates a burst oscillation signal for ultrawideband band;

a generation circuit that generates a trigger signal that causes oscillation by the oscillation circuit to be started; and a signal generation circuit that generates a control signal to control an oscillation state of the oscillation circuit;

wherein the oscillation circuit is a differential amplifier circuit including a first differential transistor and a second differential transistor that are cross-connected to conduct oscillation, and a switch element that controls the oscillation state of the oscillation circuit based an the control signal; and wherein the trigger signal is input into the gates of the first and second transistors; and a baseband circuit that processes data and inputs the data into the generation circuit.

8. The semiconductor circuit according to claim 7, wherein the pulse generator and the baseband circuit are formed on the same semiconductor chip.

* * * * *